(12) United States Patent
Kawase (10) Patent No.: US 6,861,838 B2
(45) Date of Patent: Mar. 1, 2005

(54) MAGNETIC DETECTION ELEMENT UTILIZING MAGNETO-IMPEDANCE EFFECT, PRODUCTION METHOD OF THE ELEMENT, AND PORTABLE EQUIPMENT USING THE ELEMENT

(75) Inventor: Masahiro Kawase, Saitama (JP)

(73) Assignee: Canon Denshi Kabushiki Kaisha, Chichibu (JP)

( * ) Notice: Subject to any disclaimer, the term of this patent is extended or adjusted under 35 U.S.C. 154(b) by 136 days.

(21) Appl. No.: 10/242,625

(22) Filed: Sep. 13, 2002

(65) Prior Publication Data
US 2003/0052671 A1 Mar. 20, 2003

(30) Foreign Application Priority Data

Sep. 17, 2001 (JP) ........................................ 2001-280971
Aug. 28, 2002 (JP) ........................................ 2002-248545

(51) Int. Cl.⁷ .......................... G01R 33/02; G01R 33/05
(52) U.S. Cl. ........................ 324/249; 324/244; 324/252; 324/260; 360/110
(58) Field of Search ................................ 324/244, 249, 324/252, 260; 29/592.1; 360/110

(56) References Cited

U.S. PATENT DOCUMENTS

| | | | | |
|---|---|---|---|---|
| 4,864,238 A | * | 9/1989 | Seitz .......................... 324/253 |
| 4,916,563 A | | 4/1990 | Kawase ....................... 360/122 |
| 5,038,104 A | | 8/1991 | Wikswo, Jr. et al. ....... 324/258 |
| 5,202,806 A | | 4/1993 | Kawase ....................... 360/120 |
| 5,412,597 A | | 5/1995 | Miyazaki et al. ............ 365/174 |
| 5,426,631 A | | 6/1995 | Miyazaki et al. ............ 369/126 |
| 5,684,659 A | | 11/1997 | Kawase et al. .............. 360/125 |
| 5,764,055 A | | 6/1998 | Kawase ....................... 324/249 |
| 5,831,431 A | | 11/1998 | Gottfried-Gottfried et al. ............ 324/239 |
| 5,889,403 A | | 3/1999 | Kawase ....................... 324/249 |
| 5,903,414 A | | 5/1999 | Kawase ....................... 360/110 |
| 6,028,427 A | * | 2/2000 | Kawase ....................... 324/249 |
| 6,068,102 A | | 5/2000 | Kawase ....................... 194/317 |
| 6,073,845 A | | 6/2000 | Kawase ....................... 235/449 |
| 6,104,593 A | | 8/2000 | Kawase et al. .............. 361/143 |
| 6,183,889 B1 | * | 2/2001 | Koshiba et al. ............. 428/692 |
| 6,232,767 B1 | | 5/2001 | Kawase et al. .............. 324/174 |
| 6,246,226 B1 | | 6/2001 | Kawase et al. .............. 324/168 |
| 6,310,475 B1 | | 10/2001 | Kawase et al. .............. 324/235 |
| 6,404,182 B1 | | 6/2002 | Kawase et al. .............. 324/173 |
| 6,429,651 B1 | * | 8/2002 | Choi et al. .................. 324/249 |
| 6,433,535 B1 | * | 8/2002 | Marx et al. ............ 324/207.21 |
| 6,456,068 B1 | | 9/2002 | Kawase ....................... 324/249 |
| 6,566,872 B1 | * | 5/2003 | Sugitani ...................... 324/249 |
| 6,593,841 B1 | * | 7/2003 | Mizoguchi et al. ......... 336/200 |
| 6,642,705 B2 | | 11/2003 | Kawase ................... 324/117 R |
| 6,650,112 B2 | * | 11/2003 | Takayama et al. .......... 324/249 |
| 6,690,157 B2 | * | 2/2004 | Kowalski et al. ...... 324/207.21 |

FOREIGN PATENT DOCUMENTS

| | | | |
|---|---|---|---|
| EP | 0 284 196 A2 | 2/1988 | .......... G01R/33/04 |
| EP | 0 399 499 A2 | 5/1990 | ......... G01R/33/035 |
| EP | 0 777 127 A2 | 6/1997 | ......... G01R/33/02 |
| EP | 0 899 798 A2 | 3/1999 | .......... H01R/43/10 |
| EP | 0 930 508 A1 | 7/1999 | ......... G01R/33/02 |
| EP | 1 052 519 A1 | 11/2000 | .......... G01R/33/04 |
| JP | 3-94613 | 4/1991 | |
| WO | WO 01/27592 A1 | 4/2001 | .......... G01N/21/00 |

* cited by examiner

Primary Examiner—Anjan Deb
Assistant Examiner—Darrell Kinder
(74) Attorney, Agent, or Firm—Fitzpatrick, Cella, Harper & Scinto (57) ABSTRACT

A magnetic detection element suitable for detecting a strength of an external magnetic field, has a magnetic thin film formed on a single non-magnetic substrate, a circuit that applies a high-frequency current to the magnetic thin film, and a spiral-type planar coil that is stacked on the magnetic thin film with an insulating layer, in between. The magnetic thin film is formed in a longitudinal shape, and magnetic anisotropy is provided such that the direction of easy magnetization is orthogonal to the longitudinal direction of the longitudinal shape.

8 Claims, 10 Drawing Sheets

FIG. 1A

MAGNETIC FIELD DETECTING DIRECTION

FIG. 1B

CASE OF AC BIAS

FIG. 1C

CASE OF DC BIAS

MAGNETIC DETECTION ELEMENT UTILIZING MAGNETO-IMPEDANCE EFFECT, PRODUCTION METHOD OF THE ELEMENT, AND PORTABLE EQUIPMENT USING THE ELEMENT

BACKGROUND OF THE INVENTION

1. Field of the Invention

The present invention relates to a magnetic detection element that uses a magneto-impedance element comprising a magnetic body as a magnetic detection portion in which impedance between both ends of the magnetic body changes according to an external magnetic field when a high-frequency current is applied to the magnetic body. The invention also relates to a method of producing such element, and portable equipment equipped with the element.

2. Related Background Art

Recently, since small information terminal functions of mobile phones, PDAs and the like have been developed, needs of displaying the magnetic azimuth have increased in map information display, GPS mounting, etc.

However, since high-density mounting has been required in connection with the miniaturization of portable equipment, the demand for area and height (the demand for "real estate", and the constraints to be met in designing components in order for them to fit within the space available) has become severe. As an azimuth sensor, a fluxgate sensor and a magnetoresistive element (MR sensor) already are known, but, since there are limits on their sizes, a magnetic field sensor in chip part size has been desired.

Figure 14:
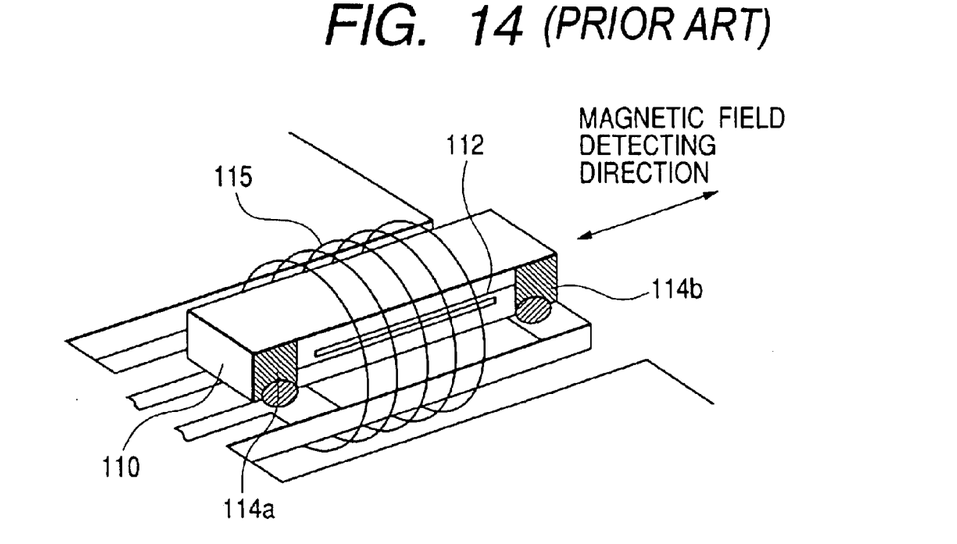
FIG. 14 is a perspective view showing a conventional magnetic detection element.

As described in Japanese Patent No.3096413, applications of an azimuth sensor made of a magnetic thin film have been already proposed. As shown in FIG. 14, an element comprising a parallel pattern 112 composed of a plurality of slender and straight lines which is formed with a magnetic thin film on a non-magnetic substrate 110 made of glass or the like has been already put to practical use, and hence, a small-sized element like a chip resistor has been realized. The sensing operation is performed by applying a high-frequency current to electrodes 114a and 114b, that are both ends of the pattern 112, and the sensor is used by changing impedance of both the ends in a magnetic field detecting direction shown by an arrow in the figure.

Figure 15:
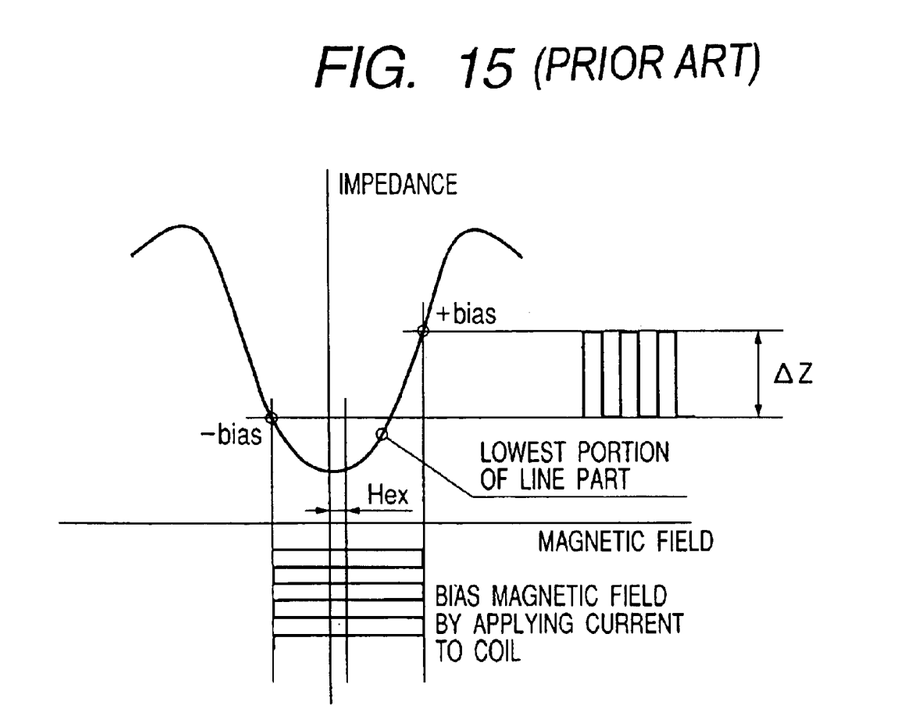
FIG. 15 is a graph showing the characteristic of the element of FIG. 14.

The change of the impedance to the external magnetic field shows a V-characteristic as shown in FIG. 15, and an inclined portion of this V-characteristic is used for sensing operation. When a DC magnetic field is detected like an azimuth sensor, a coil 115 is wrapped as shown in FIG. 14 to apply an alternating current bias, operating points are set in the inclined portion of the V-characteristic in plus and minus side portions of the magnetic field, and difference ΔZ between impedances at both the operating points to the external magnetic field Hex is taken out as an electrical signal.

However, in the bias coil 115 externally mounted as shown in FIG. 14, it is not possible to make effective use of the element size (miniaturize it to the degree that would be desirable as discussed above), and hence, it is not possible to use such a coil as a space-saving component for portable equipment or the like.

Figure 16:
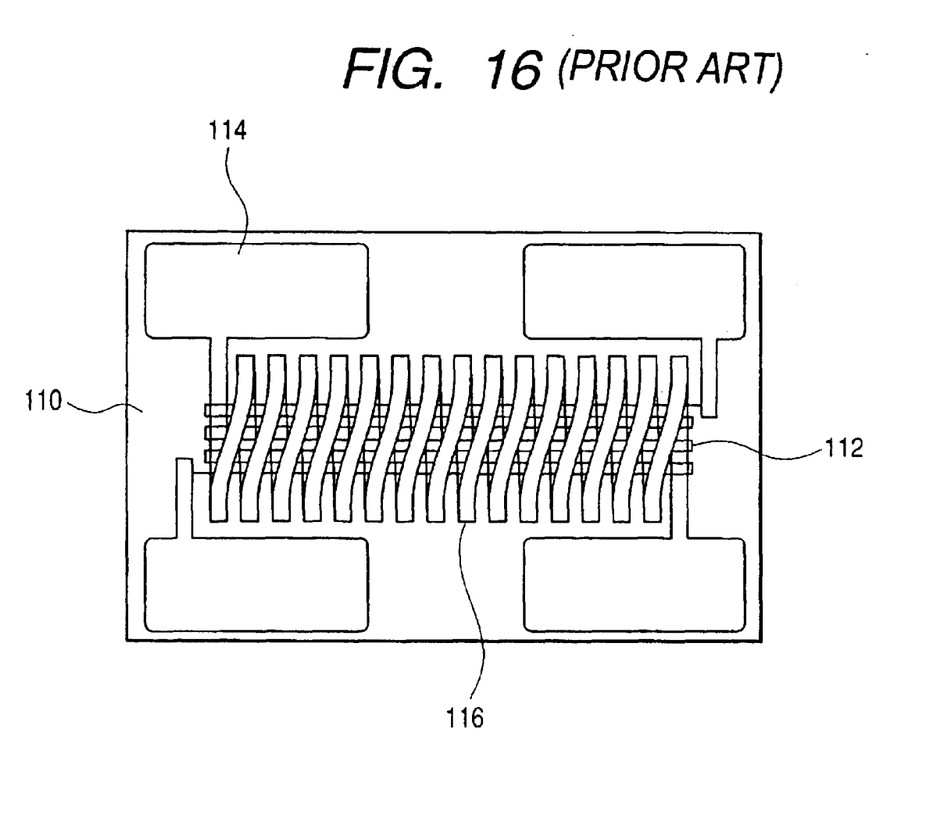
FIG. 16 is a plan view showing another conventional magnetic detection element.

If the bias coil is constructed with a conductive thin film 116 as shown in FIG. 16 and it is possible to build the bias coil in the element, the demand can be satisfactorily achieved. Nevertheless, if this solenoid-type bias coil is adopted as shown in sectional view in FIG. 17, it is necessary also to form a thin film coil layer 116a below the magnetic thin film 112. Hence, due to property degradation by stress warpage between materials through an insulating layer 118 and limitations on temperature conditions imposed by the thermal resistance of the insulating layer 118, it becomes difficult to obtain the necessary characteristics of the magnetic thin film.

Figure 17:
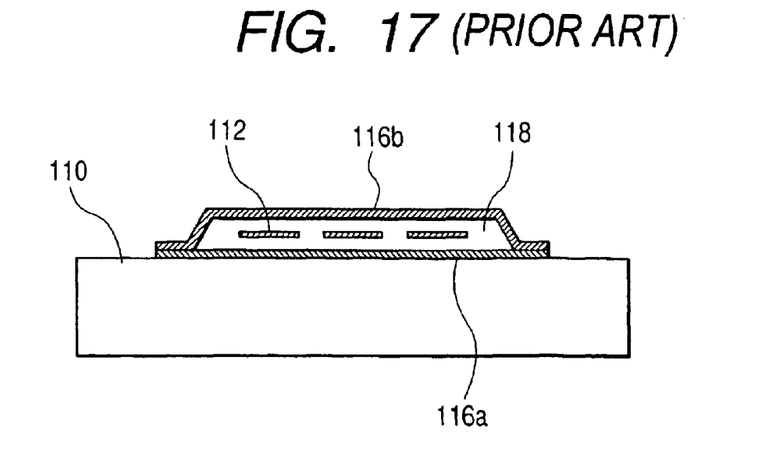
FIG. 17 is a sectional view of the element of FIG. 16.

Specifically, since the insulating film 118 and a coil conductive layer 116a are inserted between the magnetic thin film 112 and non-magnetic substrate 110 in FIG. 17, it is difficult to control the stress to which the magnetic thin film is subjected, and it is also difficult to obtain optimal conditions for the magnetic characteristics. In addition, limitations such as impossibility of temperature increase to 500° C. or higher arise in heat treatment, which tends to result in anisotropy in the magnetic characteristics.

In addition, it is also possible to use the above-described coil as a detector coil that takes out a change in magnetic flux, which the magnetic thin film generates, as an induced voltage instead of the bias coil. Even in the case of such structure, however, there is a similar problem.

SUMMARY OF THE INVENTION

An object of the present invention is to provide an element structure by which a device characteristic becomes stable and size is not sacrificed when a bias coil or a detecting coil is built in this chip size of magnetic detection element.

One of several structures provided by the present inventors for achieving the above-mentioned object of the present invention is as follows.

A magnetic detection element for detecting the strength of an external magnetic field comprises:

a magnetic thin film formed on a single non-magnetic substrate;

a circuit that applies a high-frequency current to the above-described magnetic thin film; and a spiral planar coil that is stacked on the above-described magnetic thin film through an insulating layer, wherein the above-described magnetic thin film is formed in a longitudinal shape and magnetic anisotropy is given so that direction of easy magnetization axis may become orthogonal to the longitudinal direction of the longitudinal shape.

In addition, one of the production methods provided by the present inventors for achieving the above-mentioned object is as follows.

A production method of a magnetic detection element comprises:

a step of forming a magnetic thin film on a single non-magnetic substrate;

a step of giving a predetermined magnetic characteristic to the above-described magnetic thin film by performing heat treatment in a magnetic field after forming the above-described magnetic thin film;

a step of forming an insulating film on the above-described magnetic thin film; and a step of forming a spiral coil pattern made of a conductive metal material on the above-described insulating film.

DESCRIPTION OF THE PREFERRED EMBODIMENTS

Hereafter, the preferred embodiments of the present invention will be explained with referring to the attached drawings.

(Embodiment 1)

Figure 1A:
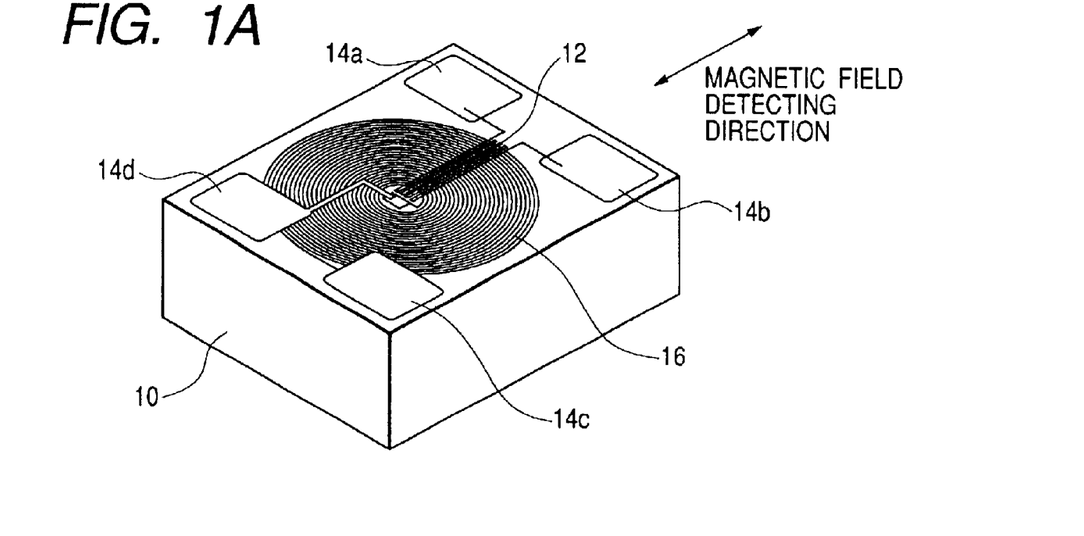
FIG. 1A is a perspective view showing an embodiment of a magnetic detection element of the present invention.
Figure 1B:
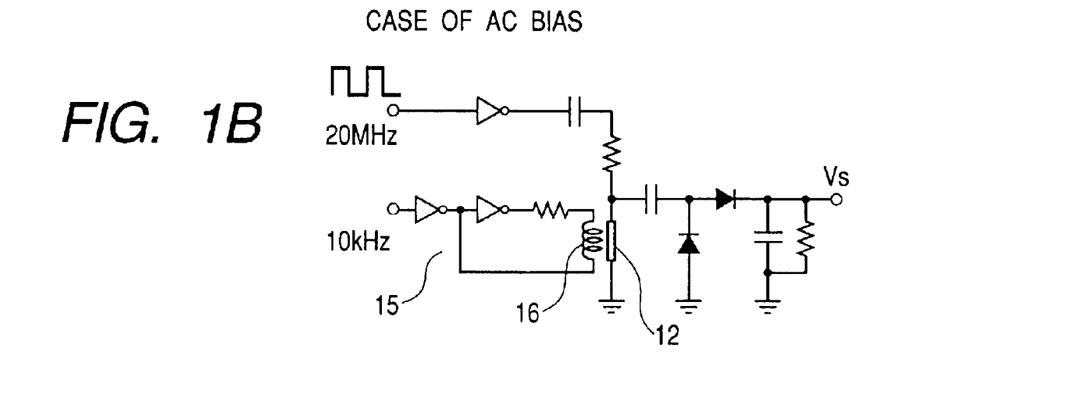
FIGS. 1B and 1C are diagrams showing circuits connected to respective electrodes of the magnetic detection element of FIG. 1A.
Figure 1C:
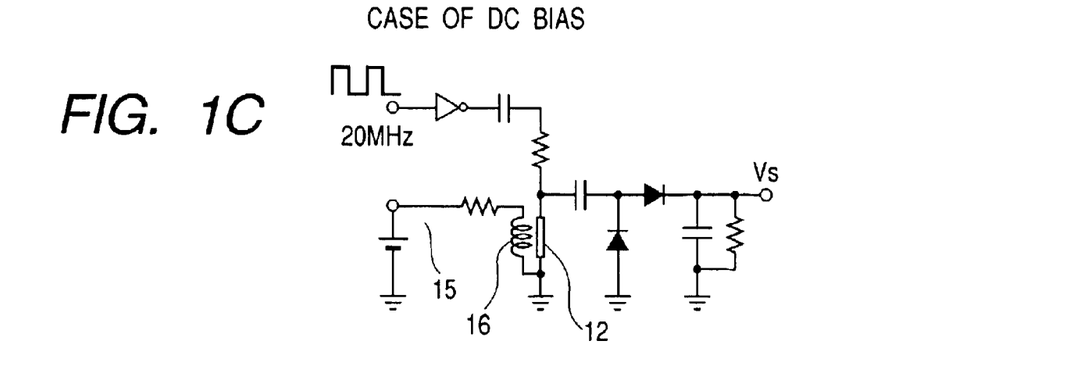

A first embodiment is shown in FIGS. 1A to 1C.

A magnetic detection portion 12 that has a structure formed by folded magnetic thin film patterns, which are slender and are arranged parallel to each other, on a single non-magnetic substrate 10 made of a glass or the like, and both ends of the magnetic detection portion 12 are connected to electrodes 14a and 14b. The magnetic field detecting direction of the magnetic detection portion is a longitudinal direction of the patterns, as shown by an arrow in the figure. In addition, the magnetic detection portion is given magnetic anisotropy such that the direction (axis) of easy magnetization is orthogonal to the longitudinal direction. On the magnetic detection portion 12, sandwiching a first insulating layer, a flat spiral coil 16 is arranged so that its center coincides with an end of the magnetic field detection portion 12. Both ends of the above-described coil are connected to electrodes 14c and 14d, sandwiching a second insulating layer. (To facilitate it being understood, the illustration of the insulating layer will be explained in connection with the following production method.) In this structure, a current is applied from a current-supply circuit, shown in FIGS. 1B and 1C, to the spiral coil 16 through the electrodes 14c and 14d, and a bias magnetic field is applied to the magnetic detection portion by using a magnetic field that is generated from a coil line crossing on the magnetic detection portion.

Figure 2:
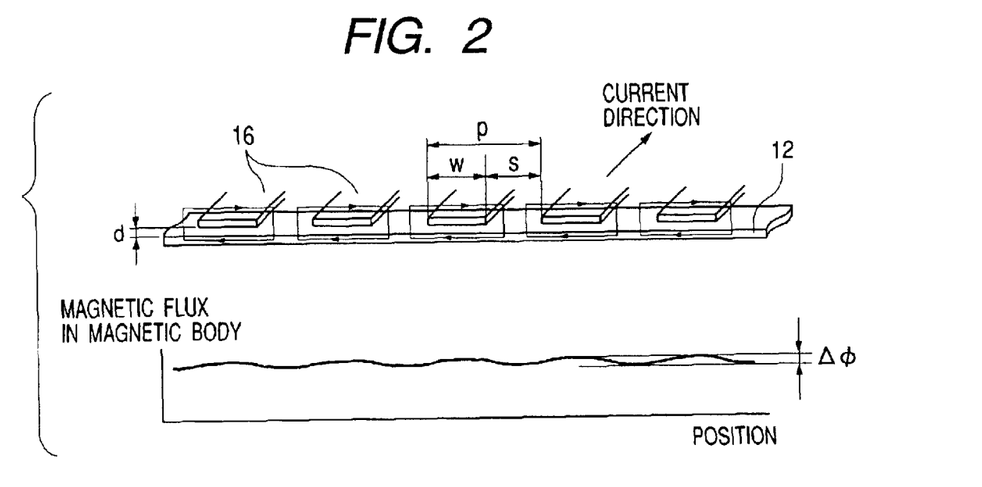
FIG. 2 is a perspective sectional view of a spiral coil.

Specifically, this will be explained with reference to the perspective sectional view of FIG. 2.

When a current is made to flow into the coil 16 in the direction shown by the arrow, a magnetic field is imparted to the magnetic field detection portion 12 in the right-to-left direction in the figure in each line, following to the corkscrew (or the right-hand) rule. Though magnetic flux in the magnetic field detection portion has a distribution with a ripple $\Delta\Phi$ more or less, a magnetic field is applied as a bias.

Figure 3:
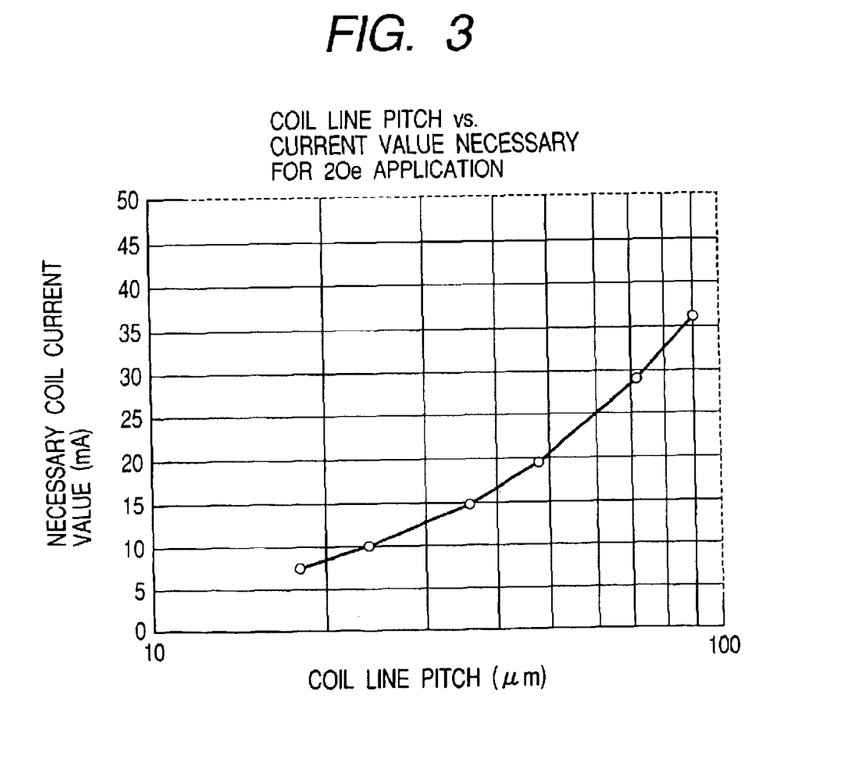
FIG. 3 is a graph showing the relationship between coil pitch and necessary coil current value.

Since the strength of the magnetic field applied to the magnetic field detection portion 12 is inversely proportional to a line pitch p of the coil, the necessary coil current value has the characteristic as shown in FIG. 3. In the inclined portion of the V-characteristic shown in FIG. 15, if a lowest portion of the inclined part with good linearity is 2 Oe, then an applied magnetic field of at least 2 Oe is necessary, and the result of measuring the current value for obtaining 2 Oe in the prototyping of the element where the line pitch of the coil was changed is the characteristic shown in FIG. 3. Since it was not possible directly to measure the magnetic field of 2 Oe from the coil, a magnetic field was applied in the Helmholtz coil, and a voltage value at the application of 2 Oe was obtained as the element characteristic. After that, the coil current that produced the desired result was searched for, to determine the necessary current value.

As a result, in consideration of making portable equipment, it is difficult to supply a current exceeding 20 mA, and for that, it is desirable to make the line pitch of the coil 50 $\mu$m or less. Actually, it is desirable to make the pitch 25 $\mu$m or less so that the current becomes 10 mA or less. In addition, in regard to narrowing the pitch, a pitch of 8 $\mu$m or more consisting of linewidth of 5 $\mu$m or more and a space of 3 $\mu$m or more is desirable, due to a problem of a supply voltage and heat generation by the increase of coil resistance, and the limitations on the production process of width w and height t of the coil line.

In addition, though bias magnetic field strength also depends on a gap d between the coil and the magnetic field detection portion, magnetic flux from the coil is absorbed by a magnetic body that is the magnetic field detection portion to form a magnetic circuit. Hence, the magnetic flux change in the magnetic body that is caused by the gap d is gentle. Specifically, the decrease of magnetic flux in the magnetic body in a case of d=10 $\mu$m is about 7% as against a case of d=1 $\mu$m, which is small. That is, it is not necessary to manage the gap d, i.e., the thickness of the insulating film between the coil and the magnetic field detection portion, with a degree of precision that would be particularly difficult or expensive. This results in convenience in production.

Figure 4A:
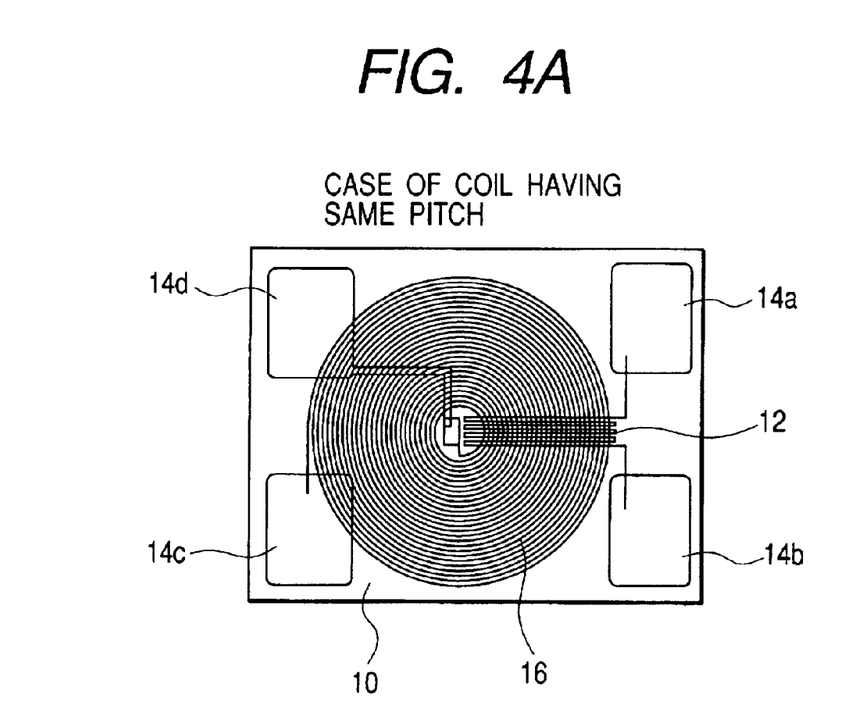
FIG. 4A is a plan view showing a case of a coil having the same pitch.
Figure 4B:
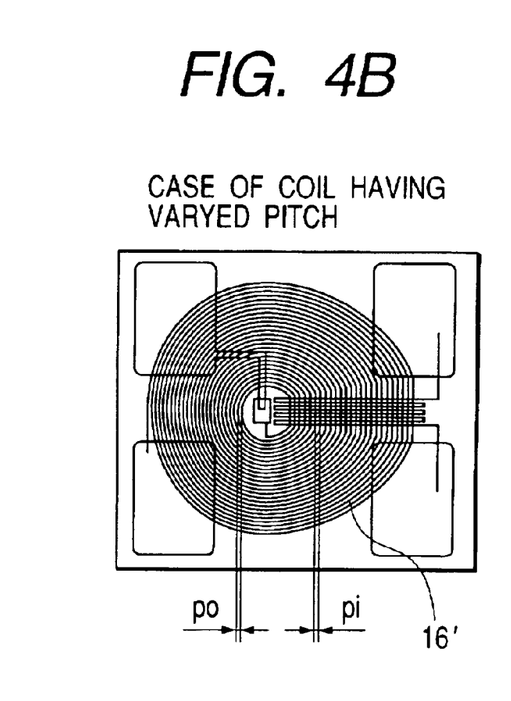
FIG. 4B is a plan view showing a case of a coil having varied pitches.

Since the spiral coil 16 in this embodiment contacts with the magnetic detection portion 12 in micron order, the overhead and vicinity of the magnetic field detection portion contribute to the application of the bias magnetic field. Then, if the size of necessary patterns is secured, other pattern portions can be freely set. As shown in FIG. 4B, by relatively narrowing other pattern pitches po against a pattern pitch pi in the vicinity of the magnetic detection portion, it becomes possible to aim at further miniaturization of the element in comparison with the case of FIG. 4A, where the pitches are the same.

In addition, if the electrodes 14 are arranged more toward the inside so that the electrodes 14 may overlap the coil 16, it is possible to lessen the size of the element. In addition, it is convenient in high density substrate mounting that all electrodes of the element are formed on one plane and that the electrodes on the formation plane and an electrode portion of a mate substrate are two-dimensionally jointed by a solder joint.

The detection of an external magnetic field by using the magnetic detection element having the above-mentioned structure is performed by detecting the amplitude and direction of the external magnetic field by applying a current from the current-supply circuit (refer to FIGS. 1B and 1C) for bias magnetic field generation to the spiral coil 16 through the electrodes 14c and 14d, applying a high-frequency current from other current-supply circuits (refer to FIGS. 1B and 1C) to the magnetic detection portion 12 through the electrodes 14a and 14b, applying the bias magnetic field to the magnetic detection portion 12, and changing impedance in the magnetic field detecting direction shown by the arrow in FIG. 1A.

Next, a method of producing the magnetic detection element according to the embodiment in FIGS. 1A to 1C will be explained with reference to FIGS. 5A to 5E.

Figure 5A:
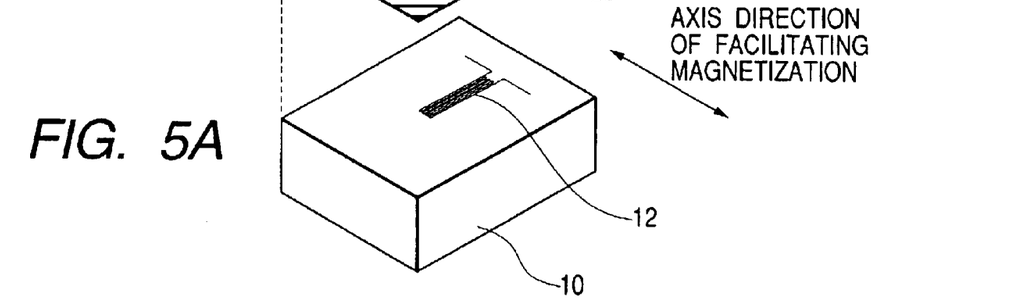
FIGS. 5A, 5B, 5C, 5D and 5E are step views showing the production process of the magnetic detection element of FIG. 1A.
Figures 5B, 5C, 5D, 5E:
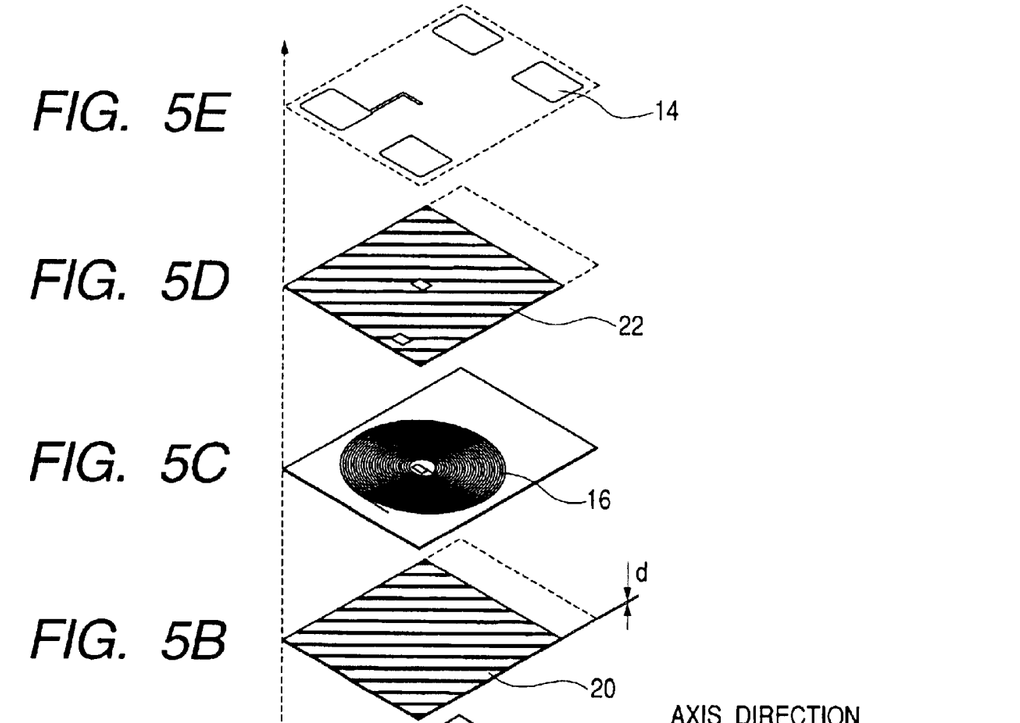

A Ni—Fe metal magnetic film, and a high permeability magnetic thin film 12 such as a Co—Zr—Nb—based amorphous film, and a Fe—Ta—C—or Fe—Ta—N—based microcrystallite film are deposited on the single non-magnetic substrate 10, consisting of glass, ceramic, or the like, by sputtering or plating. In order effectively to control the skin effect thereof, in consideration of the frequency of a current applied to the element, the film thickness is selected from the range of 1 to 5 $\mu$m. Then, the fanfold pattern 12 consisting of patterns that are slender and parallel to each other is formed by dry or wet etching. As for the characteristic of the element, an axis of easier magnetization is imparted in the direction shown by the arrow, by performing heat treatment, etc., in the magnetic field at a stage after the magnetic film deposition or after pattern etching. This is because thermal limitation is effected in the insulating film, etc., in the post-processing of coil formation. This state is shown in FIG. 5A.

Next, though a first insulating layer 20 is formed ahead of the coil formation, the thickness d of this layer particularly has no dimensional limitation, but it is made about 1 to 20 $\mu$m. As the insulating film, a non-magnetic oxide film made of $SiO_2$, $Cr_2O_3$, or the like, a heat-resistant resin film such as of polyimide, or the like is formed. The structure of this first insulating film corresponds to that in FIG. 5B.

Next, the coil 16 is produced by forming a several-microns-thick conducting layer made of copper, aluminum, gold, or the like on the entire first insulating film 20 by sputtering or plating, and forming the coil 16 by dry or wet etching so that a center of the spiral coil 16 may come to an end of the magnetic detection portion 12. As another method, it is possible to form a coil pattern in the resist film as a groove, and to form the coil by plating of a seed electrode made of gold, or the like, that is put on the bottom. The structure of this coil layer corresponds to that in FIG. 5C.

Moreover, a second insulating film 22 is formed in the same manner as in the case of the first insulating film. However, window portions for connecting both ends of the spiral coil to the electrodes are provided (refer to FIG. 5D).

Finally, by forming the electrodes 14 connected to both ends of the magnetic detection portion 12 and spiral coil 16 (refer to FIG. 5E), the element in which the bias coil is built is completed.

Figure 6:
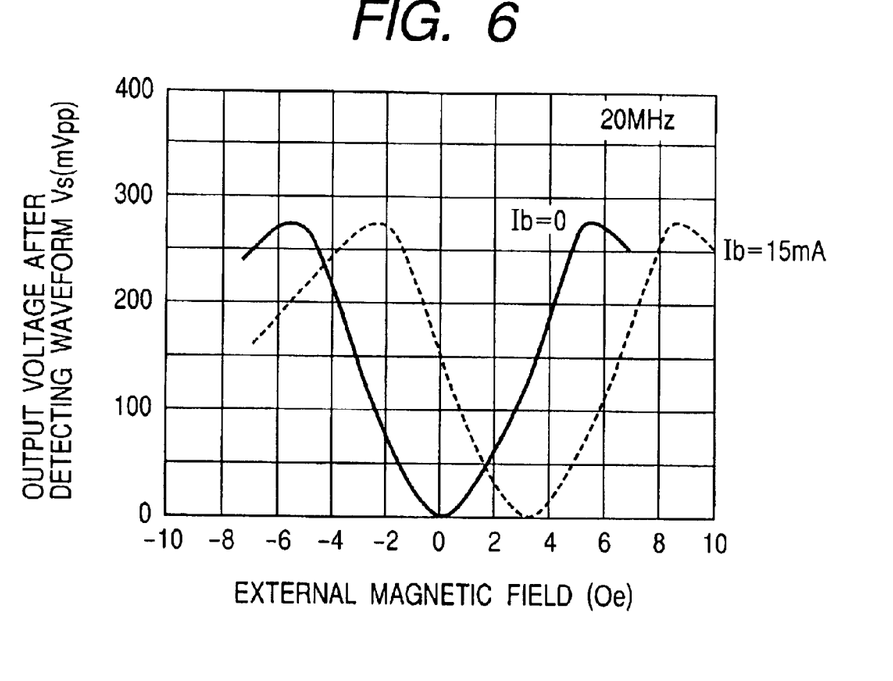
FIG. 6 is a graph showing the evaluation data of the magnetic detection element of FIG. 1A.

FIG. 6 shows the examination data of the sensor element with this structure.

Figure 7:
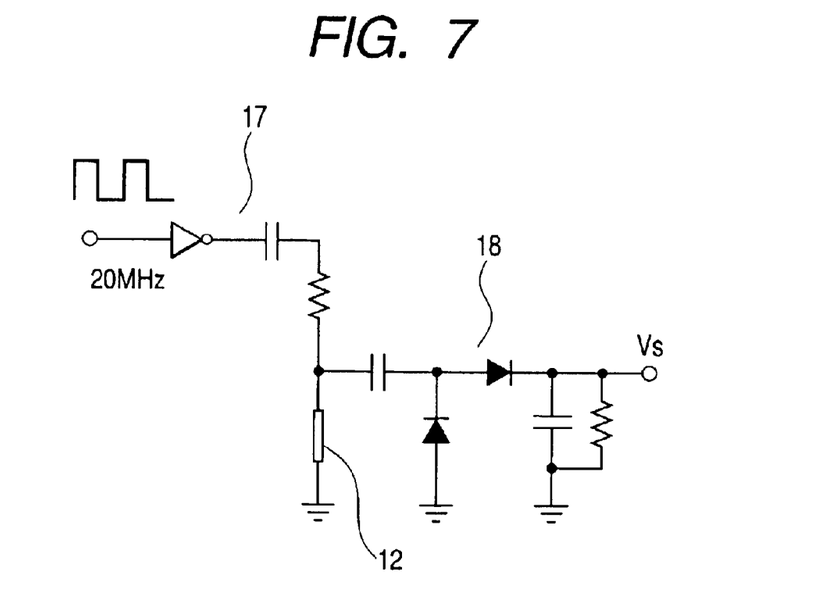
FIG. 7 is a diagram showing an evaluation circuit.

The element having the axis of easier magnetization in a plane orthogonal to the magnetic field detecting direction in the magnetic film of the magnetic field detection portion shows the V-shaped external magnetic field detection characteristic as shown in FIG. 6. The element was prototyped with a Fe—Ta—C—based soft magnetic thin film in the dimensions of 24 $\mu$m of pattern width, 1.5 mm of pattern length, 2 $\mu$m of film thickness, and 8 lines. A maximum output of 270 mV was obtained in an evaluation circuit consisting of a 5V, 20 MHz oscillation circuit 17 and a detector circuit 18 as shown in FIG. 7.

The spiral coil 16 was formed in the dimensions of 18 $\mu$m of copper pattern width of the coil, 24 $\mu$m of pitch, and 60T of crossline number on the magnetic detection portion, and the first and second insulating films were formed as 3 $\mu$m thick films, respectively.

It was confirmed that, when a 15 mA bias current was applied, a characteristic curve shifted by 3 Oe as shown by a broken line in comparison with the characteristic curve shown by a solid line in FIG. 6 in the case without the bias current, and hence, it was possible to use a portion where a sensibility inclination was large.

Figure 8:
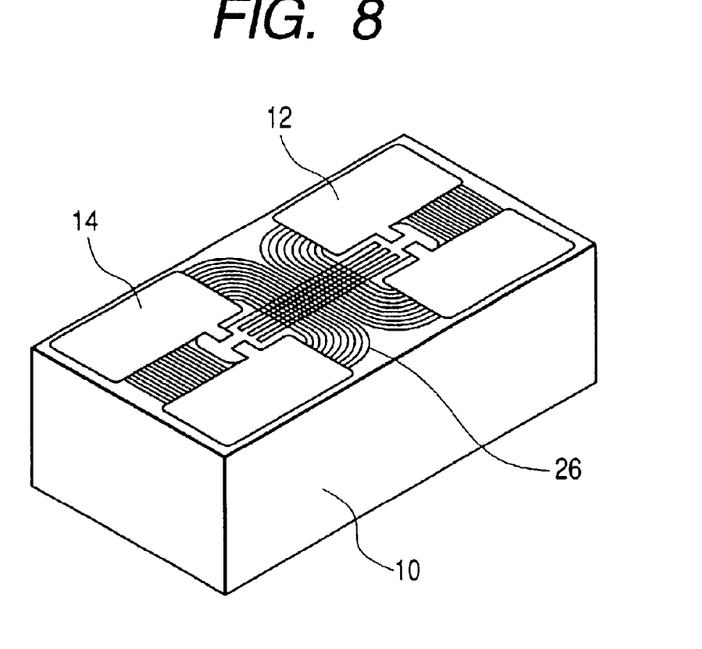
FIG. 8 is a perspective view showing another embodiment of the magnetic detection element of the present invention.

In addition, it is possible to obtain the effects of the present invention as shown in FIG. 8, even when a magnetic detection element is formed by forming a coil portion 26 with two centers of spirals by connecting spiral coils, and stacking the coil portion 26 so that its center portions may coincide with both ends of the magnetic detection portion, respectively.

(Embodiment 2)

In the above-mentioned first embodiment, the structure of detecting the amplitude and direction of an external magnetic field by applying a high-frequency current to a magnetic body, and detecting an impedance change between both ends thereof is shown. However, it is also good to make the structure of detecting the amplitude and direction of an external magnetic field by applying a high-frequency current to a magnetic body, and detecting an induced voltage change generated in a spiral coil according to the external magnetic field. In this case, the spiral coil is not used for bias magnetic field application, but for induced voltage detection.

Figure 9:
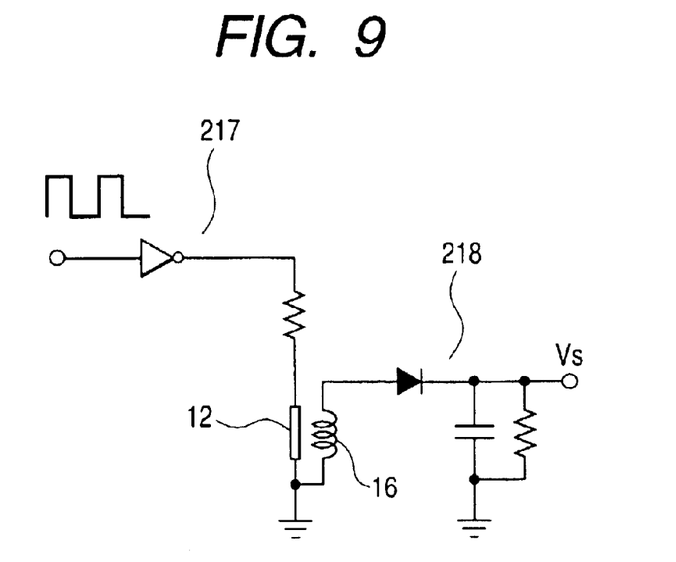
FIG. 9 is a diagram showing an operation circuit of the magnetic detection element in a second embodiment of the present invention.

Its specific structure will be explained by using FIG. 9.

Figure 10:
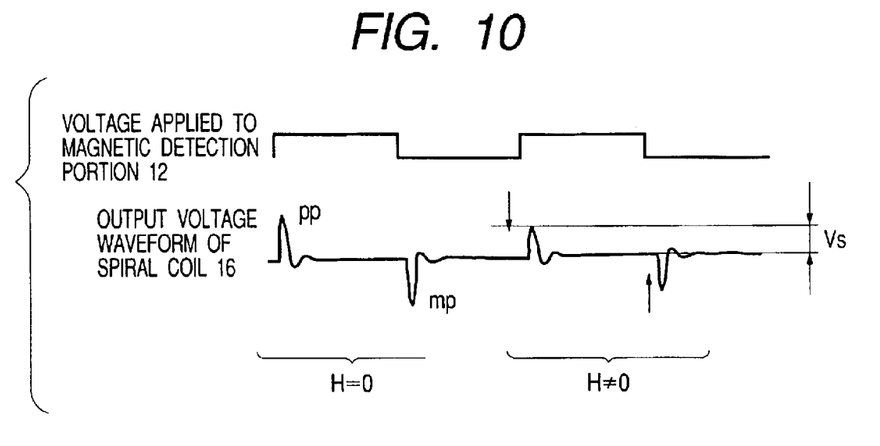
FIG. 10 is a chart showing the correspondence of an output of a spiral coil to an applied voltage to a magnetic detection portion.
Figure 11:
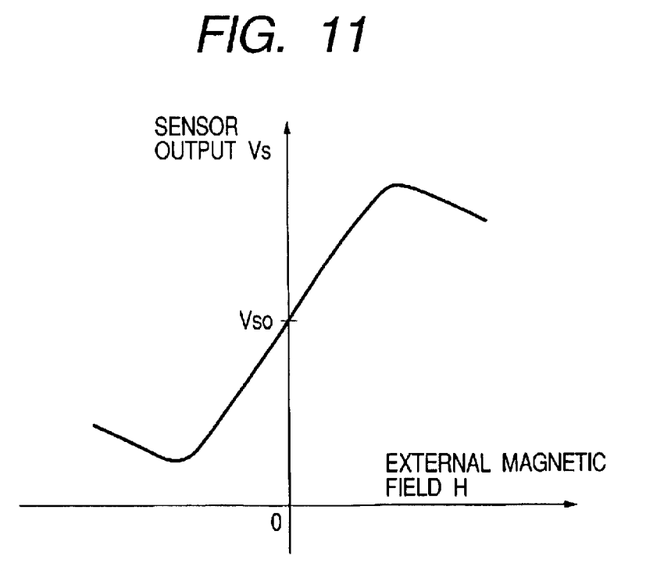
FIG. 11 is a graph showing a detection output in the circuit of FIG. 9.

Similarly to the conventional, a pulse-oscillated current is applied to the electrodes 14a and 14b, of the magnetic detection portion 12 of the element by an oscillation circuit 217. As a waveform is shown in FIG. 10, a pulse voltage output with peaks corresponding to the rise and fall of the pulsed current flowed into the magnetic detection portion 12 appears at both ends of the spiral coil. Since this peak height Vs changes almost proportionally to the external magnetic field, this peak value is taken out by a detection circuit 218. It is also good to output a voltage by processing peaks in a minus side or both sides besides peaks in a plus side. The characteristic at the time when the peak values in the plus side are detected is an S-shaped curve characteristic as shown in FIG. 11. Since the magnetic detection portion 12 and spiral coil 16 adjoin in the gap of several microns with sandwiching the insulating film, it is possible to efficiently take out the magnetic flux change in the magnetic thin film to the external magnetic field to obtain a high induced voltage.

(Embodiment 3)

Next, an embodiment of portable equipment where the magnetic detection element is built, as explained in the above-mentioned embodiment, will be explained. When two magnetic detection elements are used and arranged so that respective magnetic field detecting directions may be orthogonal, it is possible to take out signals corresponding to respective external magnetic fields in two orthogonal directions from respective magnetic field detecting elements. Using this, it is possible to constitute a magnetic sensor device that detects external magnetic fields in two directions, for example, an azimuth sensor that detects components of the magnetic fields in terrestrial magnetism in the X-and Y-directions orthogonal to each other, and detects an azimuth angle based on the direction of the terrestrial magnetic vector (- and S-directions that a magnetic needle of a compass indicates).

Figure 12:
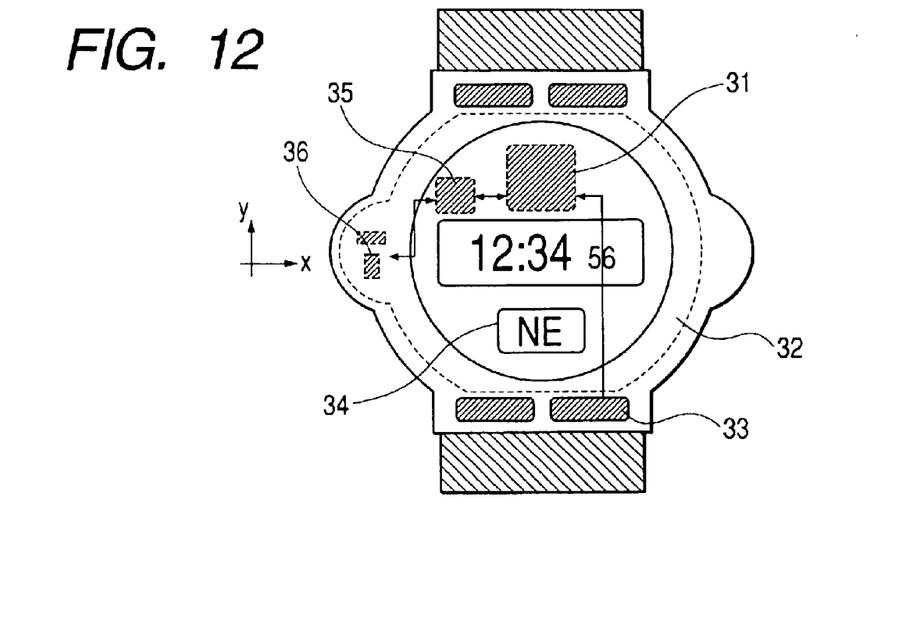
FIG. 12 is a view showing a wristwatch in which the magnetic detection element of the present invention is built as an azimuth sensor.

In this embodiment, examples of combining two magnetic detection elements of the present invention and building them in a wristwatch and a PDA as azimuth sensors will be shown. In this embodiment, the two magnetic detection elements are mounted on a circuit board of the watch so that their longitudinal directions may be orthogonal. In FIG. 12, reference numeral 31 denotes a CPU that controls watch functions and an azimuth sensor, and this CPU performs arithmetic processing of the azimuth angle on the basis of the output from each of the magnetic detection elements. On a watch circuit board 32, two magnetic detection elements are mounted, and various circuits necessary for watch functions such as CPU 31 are formed besides an azimuth sensor drive circuit 35. Reference numeral 33 denotes various operating buttons concerning the watch function, 34 does a display part that displays time and azimuth. In this embodiment, it is possible to freely set inclination angles of the orthogonal axes (X- and Y-directions) of two magnetic detection elements, and a reference in the azimuth is finally defined on software.

Figure 13:
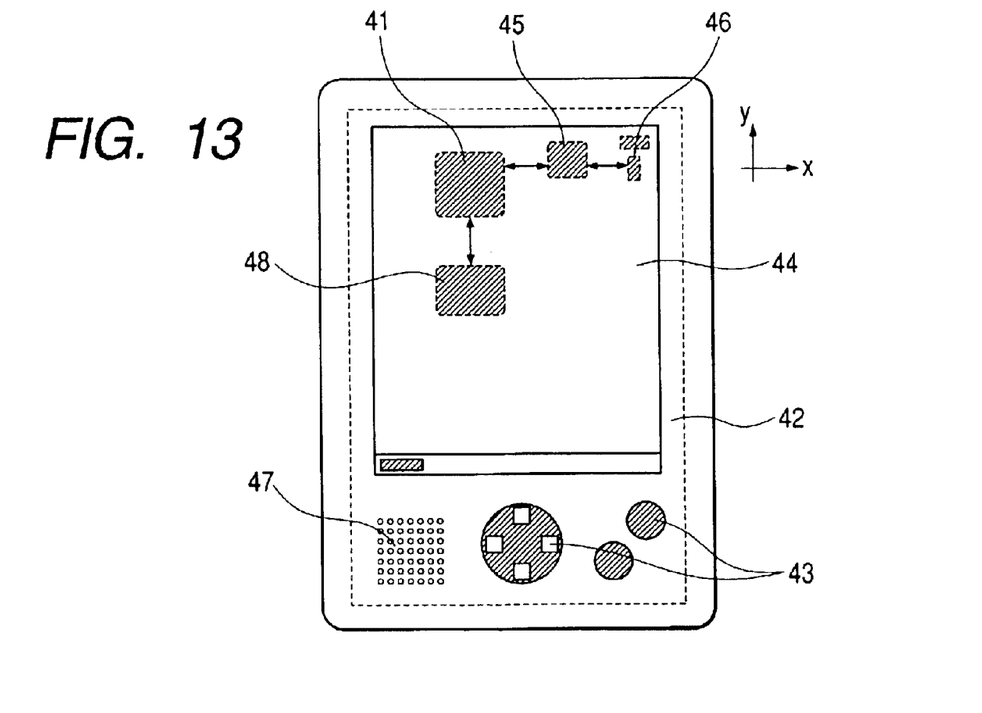
FIG. 13 is a view showing a PDA in which the magnetic detection element of the present invention is built as an azimuth sensor.

In addition, as another specific example, an example of building the magnetic detection element of the present invention in a PDA as an azimuth sensor unit is shown in FIG. 13. In this embodiment, the azimuth sensor unit is mounted on a main circuit board of the PDA. In FIG. 13, a CPU 41 takes charge of various functions of the PDA, and further controls the azimuth sensor unit also to execute the arithmetic processing of an azimuth angle. On a PDA main circuit board 42, an azimuth sensor unit is mounted, and various circuits necessary for PDA functions such as CPU 41 are formed besides an azimuth sensor drive circuit 45. Reference numeral 43 denotes various operating buttons, and 44 does a display part. Reference numeral 47 denotes a speaker. Reference numeral 48 denotes an about 32 MB memory connected to the CPU 41. In this embodiment, it is possible to freely set inclination angles of the orthogonal axes (X- and Y-directions) of two magnetic detection elements, and a reference in the azimuth is finally defined on software. In this embodiment, it is possible to detect a current position with a GPS sensor not shown in the drawings, or azimuth with the azimuth detection portion 46, to retrieve map information stored in memory 48 on the basis of the detection result, and to display the current position and azimuth on a map with displaying the map information in the vicinity of the current position.

As explained above, according to the present invention, in respect of a highly sensitive thin film magneto-impedance element, it becomes possible to provide a small element whose performance is stable and in which a bias coil or a detection coil is built. In addition, since there are also sufficient numbers of degrees of freedom of electrodes and a coil pattern, it is also possible to design a smaller element. In addition, also in regard to a production method of the element, since a coil is stacked and formed thereabove after securing characteristics of the element, the production method is simple, and has a feature of being able to obtain stable performance. Furthermore, since the coil can be closely arranged to a magnetic detection portion in several-micron order, it is possible to efficiently apply a bias magnetic field or detect an induced voltage.

What is claimed is:

1. A magnetic detection element for detecting a strength of an external magnetic field, comprising:
   a magnetic thin film formed on a single non-magnetic substrate;
   a circuit that applies a high-frequency current to the magnetic thin film; and
   a spiral-type planar coil that is stacked on the magnetic thin film through an insulating layer between the coil and the film,
   wherein the magnetic thin film is arranged between a center and an end of the planar coil so that respective lines of the planar coil cross the magnetic thin film, and a line pitch of the planar coil crossing the magnetic thin film is larger than a line pitch of another portion of the planar coil, and
   wherein the magnetic thin film is formed in a longitudinal shape and has magnetic anisotropy such that the direction of easy magnetization is orthogonal to a longitudinal direction of the longitudinal shape.

2. The element according to claim 1, further comprising:
   a circuit that supplies a current to the planar coil so as to apply a bias magnetic field to the magnetic thin film; and
   a circuit that detects a change in impedance of the magnetic thin film.

3. The element according to claim 2, wherein a line pitch S of the planar coil in a portion crossing the magnetic thin film is 8 $\mu$m $\leq S \leq 50$ $\mu$m.

4. The element according to claim 2, wherein a line pitch S of the planar coil in a portion crossing the magnetic thin film is 8 $\mu$m $\leq S \leq 25$ $\mu$m.

5. The element according to claim 1, wherein the planar coil comprises two coils that are arranged so that each coil has a center located at a separate end of the magnetic thin film, and wherein the coils are mutually connected.

6. The element according to claim 1, wherein a leading electrode is formed so as to overlie the planar coil with another insulating layer between the coil and the electrode.

7. The element according to claim 1, further comprising:
   a circuit that detects a change of an induced voltage generated in the planar coil.

8. Portable equipment comprising an azimuth sensor formed by arranging magnetic detection elements according to claim 1 so as to be mutually orthogonal.

* * * * *